(12) United States Patent
Kurita (10) Patent No.: US 6,822,336 B2
(45) Date of Patent: Nov. 23, 2004

(54) SEMICONDUCTOR DEVICE (75) Inventor: Yoichiro Kurita, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 212 days.

(21) Appl. No.: 10/180,602

(22) Filed: Jun. 26, 2002

(65) Prior Publication Data
US 2003/0001253 A1 Jan. 2, 2003

(30) Foreign Application Priority Data

Jun. 27, 2001 (JP) .......................... 2001-195447

(51) Int. Cl.⁷ .......................... H01L 23/48; H01L 23/52; H01L 29/40
(52) U.S. Cl. ...................... 257/780; 257/781
(58) Field of Search .................. 257/780, 781, 257/778, 783

(56) References Cited

U.S. PATENT DOCUMENTS

| 5,550,408 | A  | * | 8/1996  | Kunitomo et al. |
| 5,869,904 | A  | * | 2/1999  | Shoji ........................ 257/779 |
| 6,232,563 | B1 | * | 5/2001  | Kim et al. .................. 174/261 |
| 6,441,496 | B1 | * | 8/2002  | Chen et al. ................. 257/777 |
| 6,664,637 | B2 | * | 12/2003 | Jimarez et al. ............. 257/772 |
| 6,674,016 | B2 | * | 1/2004  | Kubo et al. ................. 174/260 |

* cited by examiner

Primary Examiner—S. V. Clark
(74) Attorney, Agent, or Firm—Katten Muchin Zavis Rosenman (57) ABSTRACT A semiconductor device according to the invention is provided with an electrode used for connecting a semiconductor chip and a wiring board or plural semiconductor chips, an additive layer formed by doping an additive including at least one type of atom different from an atom forming the electrode in the vicinity of the surface of the electrode and an insulator formed on the surface of the electrode.

9 Claims, 6 Drawing Sheets

SEMICONDUCTOR DEVICE

BACKGROUND OF THE INVENTION

1. Field of the Invention

The present invention relates to a semiconductor device, particularly relates to the structure of an electrode for mounting a semiconductor chip.

2. Description of the Prior Art

Recently, IC or LSI has been more and more integrated and the capacity has been increased. A package in which a semiconductor chip is mounted has been small-sized, the number of pins has been increased and the density of the semiconductor chip has been enhanced. Further, a multi-chip package (MCP) in which plural semiconductor chips are mounted has been practically used.

Further, as information technology is rapidly popularized, a demand for the systemization of semiconductor devices that form an information processing unit has grown. The expectation of electronic system integration technology for integrating and systemizing plural LSIs and a versatile functional block including an optical device using a compound semiconductor and a high-frequency device has increased.

In element technique to be the most important in the electronic system integration, minute bonding technique is included. For representative joining technique that has been used, wire bonding technique, flip chip (FC) joining technique and tape automated bonding (TAB) technique can be given, and as particularly the flexibility of bump bonding technique used in the flip chip joining technique is high and high-density connection is enabled, the bump bonding technique is very important. The bump bonding technique is also used in chip on chip (COC) technique which is one of high-density MCP technique.

For the current most general bump bonding technique, technique for melting a solder bump and joining using it called controlled collapsible chip connection (C4) is well-known. However, recently, from a viewpoint of conserving global environment, freedom from lead (included in solder) is demanded and a bad effect of the residue after cleaning of flux used for removing an oxide film on the surface of the solder having upon the quality also comes into question.

Figure 6A:
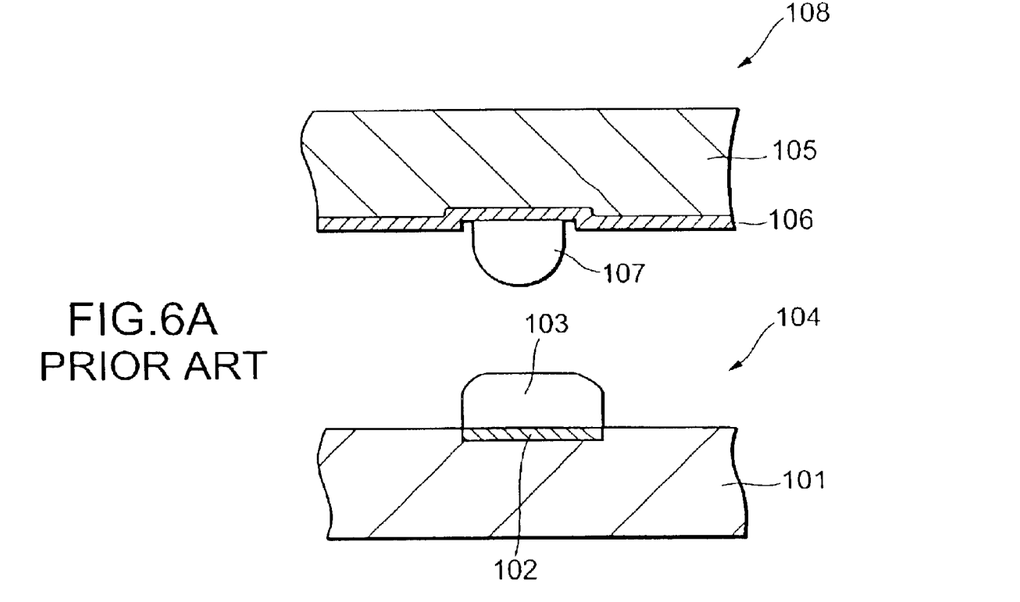
FIGS. 6A and 6B are schematic sectional views showing a bump bonding process for explaining prior art.
Figure 6B:
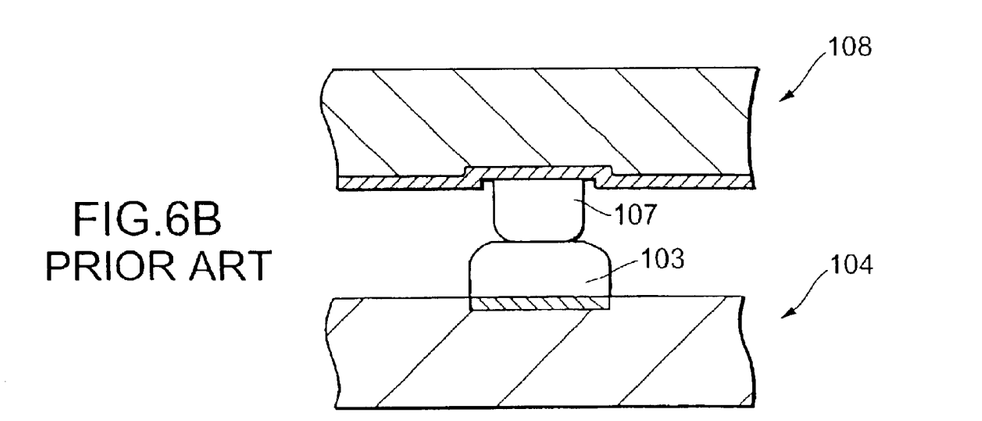

Then, in place of a solder bump, recently, joining using a gold (Au) bump is discussed. Referring to FIG. 6, the outline of the technique will be described below. FIG. 6 are sectional views showing a schematic process of COC technique for joining two semiconductor chips via a gold bump.

As shown in FIG. 6A, a pad electrode 102 is formed in a predetermined region on the surface of a first semiconductor substrate 101 and a first gold bump 103 is formed on the pad electrode 102. As described above, the first semiconductor chip 104 is formed. Wiring 106 is formed on the surface of a second semiconductor substrate 105 by copper or others and a second gold bump 107 is connected to a predetermined region of the wiring 106. As described above, a second semiconductor chip 108 is formed.

Next, as shown in FIG. 6B, the first semiconductor chip 104 and the second semiconductor chip 108 are overlapped and the first gold bump 103 on the first semiconductor chip 104 and the second gold bump 107 on the second semiconductor chip 108 are aligned. The first gold bump 103 and the second gold bump 107 are bonded, heating and pressurizing them. The temperature of heating is required to be 250° C. or more.

In technique for melting and bonding solder bumps widely used in the current mounting technology, flux is essential to remove an oxide film on the surface of solder. To keep reliability, flux is generally required to be cleaned after bonding is completed, however, it has been difficult to completely clean flux as a bump becomes minute and pitch becomes short. In FC joining using a solder bump, the solder bump is melted and the shape greatly changes. Therefore, there is a limit in shortening pitch between bumps and it is difficult to enhance the density of a semiconductor device.

In the case of FC joining using the gold bumps explained referring to the drawings, the solid phase diffusion of gold is utilized in bonding gold. Then, as described above, the relatively high temperature of 250° C. or more and pressure are required. Therefore, in mounting, IC is damaged and the characteristics of the IC are deteriorated. The problems become more remarkable as the density of IC is enhanced.

In case a copper bump estimated to be able to lower heating temperature in the bonding is applied to an electrode in place of the gold bump based upon prior art, it is very difficult to bond electrodes such as a copper bump because of a copper oxide film easily oxidized at room temperature.

BRIEF SUMMARY OF THE INVENTION

Object of the Invention

The object of the invention is to provide electrode structure which can be joined at low temperature and low energy.

Summary of the Invention

A semiconductor device according to the invention is provided with an electrode used for connecting a semiconductor chip and a wiring board or plural semiconductor chips, an additive layer in which an additive made of at least one type of atom different from the atoms of the electrode is doped in the vicinity of the surface of the electrode and an insulator formed on the surface of the electrode.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1A:
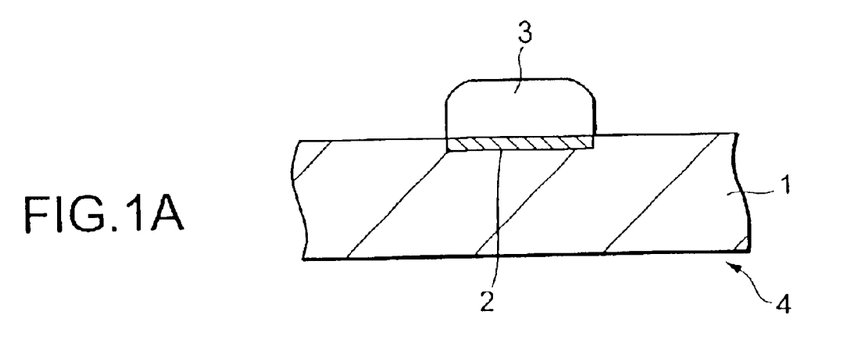
FIGS. 1A to 1C are schematic sectional views showing a bump bonding process for explaining a first embodiment of the invention.
Figure 1B:
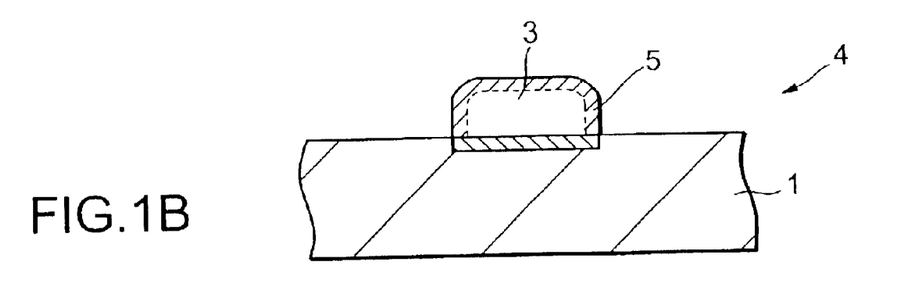
Figure 1C:
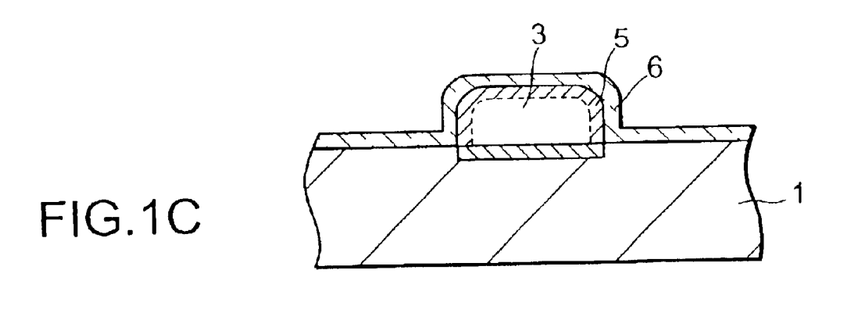
Figure 2A:
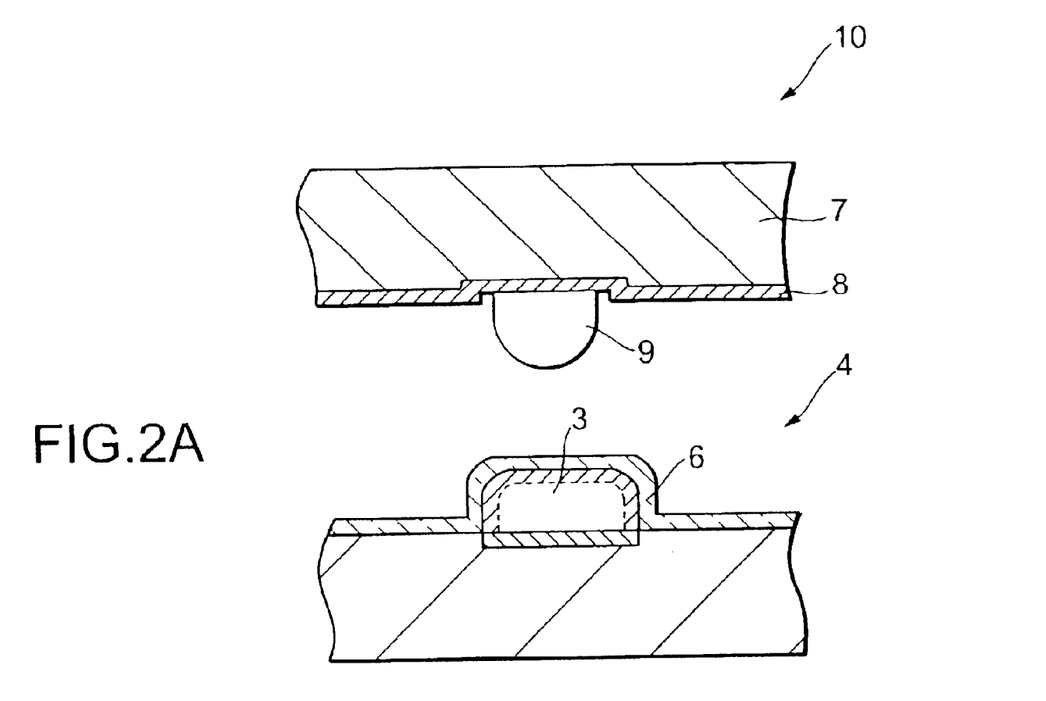
FIGS. 2A and 2B are schematic sectional views showing the next bump bonding process to the process shown in FIGS. 1.
Figure 2B:
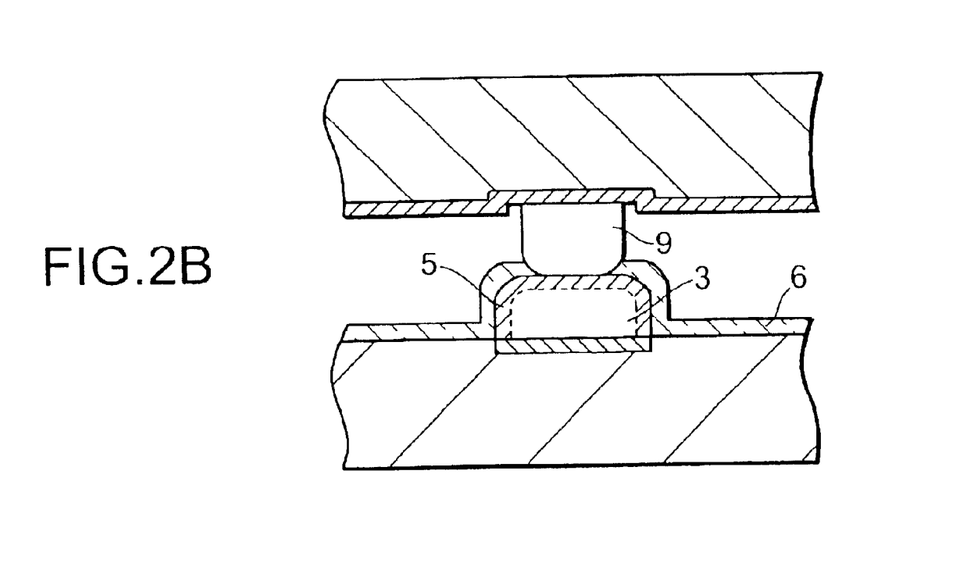

Next, referring to FIGS. 1 and 2, the outline of a first embodiment of the invention will be described. FIGS. 1 and 2 are schematic sectional views showing a case that two semiconductor chips are connected via bumps in the order of a manufacturing process. In the manufacturing process, the structure of a semiconductor device according to the invention is shown.

As shown in FIG. 1A, a pad electrode 2 is formed in a predetermined region on the surface of a first semiconductor substrate 1 according to a well-known method. The pad electrode 2 is made of aluminum or copper. A copper bump 3 is formed on the pad electrode 2. The surface of the copper bump 3 is easily oxidized differently from a case of a gold bump. The reason is that differently from noble metal such as Au, the surface of Cu is easily oxidized at room temperature. Then, such a first semiconductor chip 4 is carried in a multipurpose processor formed by a multichamber. First, the plasma processing of argon and others is applied in a first chamber of the multipurpose processor. In the plasma processing, an oxide film on the surface of the copper bump 3 is removed. In the plasma processing, inactive gas such as neon, helium, krypton and nitrogen in addition to argon is excited to be plasma and the oxide film may be also removed using a generated ion and others.

Next, the first semiconductor chip 4 is carried in a second chamber of the multipurpose processor without being exposed to the air. Each surface of the first semiconductor substrate 1 and the copper bump 3 is exposed to the plasma of halogen. As described above, as shown in FIG. 1B, an additive layer 5 including an additive such as a halogen atom is provided to the surface of the copper bump 3. In case halogen is fluorine, reactive gas such as $NF_3$ gas, $SF_6$ gas, $NF_2Cl$ gas, $NF_2H$ gas and fluorocarbon is excited to be plasma and an F ion is doped. In case halogen is chlorine, $Cl_2$ gas, HCl gas, $NF_2Cl$ gas or chlorocarbon gas is excited to be plasma. Or in case halogen is bromine (Br), $Br_2$ gas or HBr gas is excited to be plasma. In a process for forming the additive layer 5, the first semiconductor chip 4 may be also heated.

Next, the first semiconductor chip 4 is carried in a third chamber of the multipurpose processor. An extremely thin insulating film is formed overall by chemical vapor deposition (CVD) for exciting plasma. As described above, as shown in FIG. 1C, a coating layer 6 for coating each surface of the first semiconductor substrate 1 and the copper bump 3 is formed. The coating layer 6 is formed by a silicon nitride film having thickness equivalent to 3 to 5 atoms (for example, the thickness of approximately 10 nm). Or the coating layer is formed by a film acquired by laminating a silicon oxynitride film and a silicon nitride film.

The additive in the additive layer 5 in the superficial region of the copper bump 3 is confined in the region by the formation of the coating layer 6. The coating layer 6 has a function for preventing the surface of the copper bump 3 from being oxidized. It is desirable that the coating layer 6 on the surface of the copper bump 3 is formed so that the coating layer is thin (for example approximately 10 nm thick) in a part in which the bump is bonded and is thick (for example, approximately 100 nm thick) in a region except it.

Next, as shown in FIG. 2A, wiring 8 is formed on the surface of a second semiconductor substrate 7 by copper or others and a gold bump 9 is connected in a predetermined region of the wiring 8. As described above, a second semiconductor chip 10 is formed. The first semiconductor chip 4 and the second semiconductor chip 10 are overlapped, and the copper bump 3 covered with the coating layer 6 on the first semiconductor chip 4 and the gold bump 9 on the second semiconductor chip 10 are aligned.

Next, as shown in FIG. 2B, heated pressure processing is applied. In the pressure processing, it is desirable that ultrasonic vibration is applied. The copper bump 3 and the gold bump 9 are bonded by the pressure processing.

In a process for the pressure processing, the coating layer 6 is mechanically broken by the deformation of the copper bump 3. The temperature of the pressure processing is 150° C. or less. The reason why the temperature is lower is that the diffusion of a copper atom in the copper bump 3 or that of a gold atom in the gold bump 9 is accelerated by a halogen atom in the additive layer 5.

In the bonding process, the breakage of the insulating film can be also accelerated by applying moderate ultrasonic vibration or mechanical friction by scrubbing or others to interfaces of bonding when both semiconductor chips are pressed.

Next, referring to FIG. 3, the principle of the invention will be described. FIG. 3 are schematic sectional views showing a process for explaining the critical point of the invention in the processes shown in FIGS. 1 and 2.

Figure 3A:
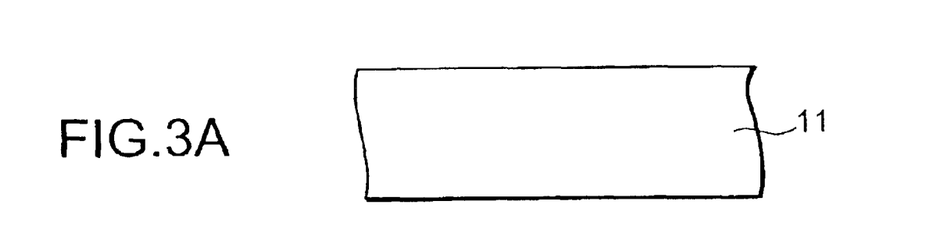
FIGS. 3A to 3D are schematic sectional views showing a metal bonding process for explaining a mechanism for accelerating bonding according to the invention.
Figure 3B:
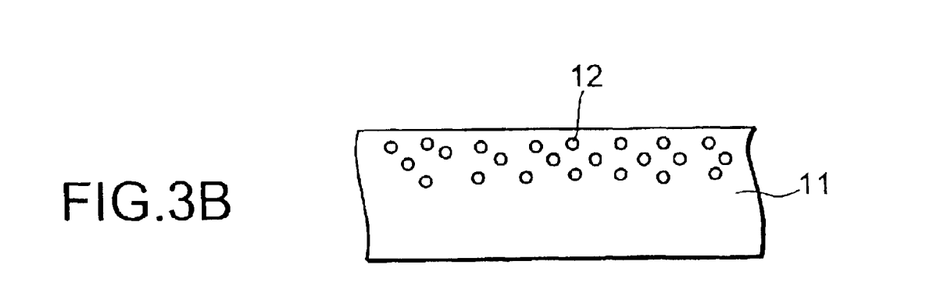

As shown in FIG. 3A, the surface of first bonding metal 11 corresponding to the copper bump 3 is cleaned. That is, an oxide layer and others are removed and the surface of the first bonding metal 11 is exposed. As shown in FIG. 3B, an additive 12 of a halogen atom or others is doped in a superficial region of the first bonding metal 11 by the plasma processing. For the conductive material of the first bonding metal 11, gold, tin (Sn), solder or indium (In) and silver (Ag) are used in addition to copper. The additive 12 may be also doped by ion plantation.

Figure 3C:
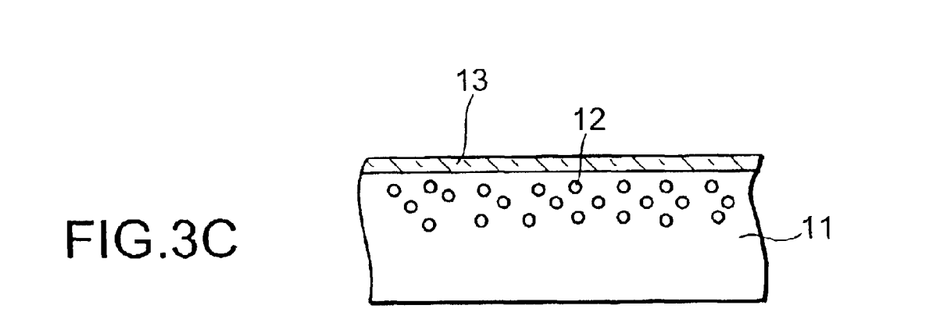

As shown in FIG. 3C, a coating layer 13 is formed on the surface of the first bonding metal 11. The coating layer 13 has a function for confining the additive 12 in the first bonding metal 11.

Figure 3D:
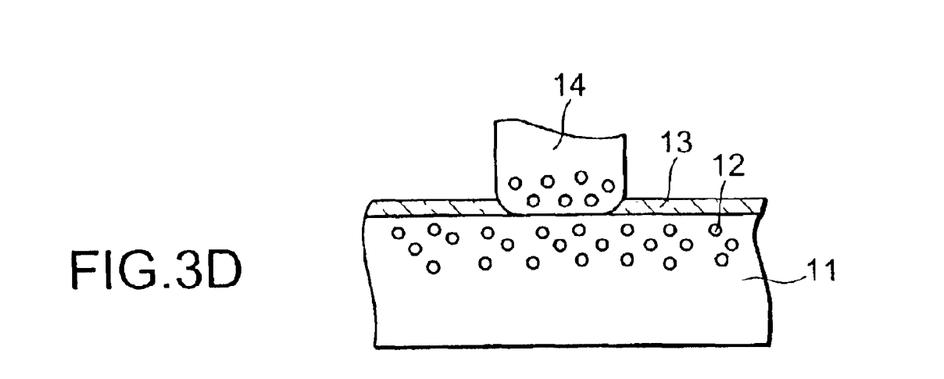

As shown in FIG. 3D, second bonding metal 14 is pressed on the first bonding metal 11. In a process for pressure processing, the additive 12 is activated and enters the second bonding metal 14 in addition to the first bonding metal 11. The activation of the additive 12 is easily caused at low temperature. The diffusion of metallic elements forming the first bonding metal 11 and the second bonding metal 14 is accelerated. As described above, the bonding of the first bonding metal 11 and the second bonding metal 14 is accelerated and the lowering of the temperature of bonding is enabled. For the conductive material of the second bonding metal 14, copper, tin, solder or indium and silver are used in addition to gold.

In the invention, as structure that atoms easily activated by heating are confined in the superficial region of the bonding metal is adopted, electrode structure in which first and second bonding metals can be bonded at low energy and low stress can be provided.

Next, referring to FIG. 4, a second embodiment of the invention will be described. This embodiment is characterized in that an adhesive is used in place of the coating layer described in the first embodiment. The same reference number is allocated to the same part as the part shown in FIGS. 1 and 2.

Figure 4A:
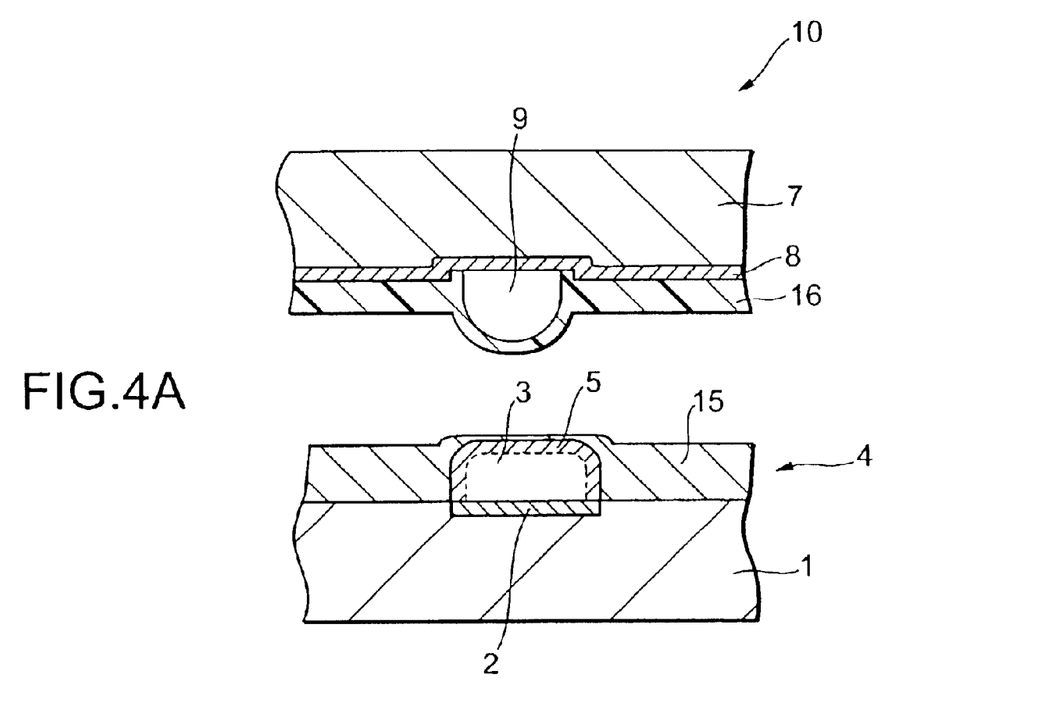
FIGS. 4A and 4B are schematic sectional views showing a bump bonding process for explaining a second embodiment of the invention.

As shown in FIG. 4A, as described in the first embodiment, a first semiconductor chip 4 provided with a pad electrode 2 in a predetermined region on the surface of a first semiconductor substrate 1 and a copper bump 3 connected to the pad electrode 2 is formed. An additive layer 5 is formed on the surface of the copper bump 3 and a first adhesive layer 15 is formed on the surface of the first semiconductor chip 4. Similarly, a second semiconductor chip 10 provided with wiring 8 on the surface of a second semiconductor substrate 7 and a gold bump 9 in a predetermined region of the wiring 8 is formed and a second adhesive layer 16 is formed on the surface of the second semiconductor chip 10. The first or second adhesive layer 15 or 16 is made of organic polymeric resin such as polyimide.

Figure 4B:
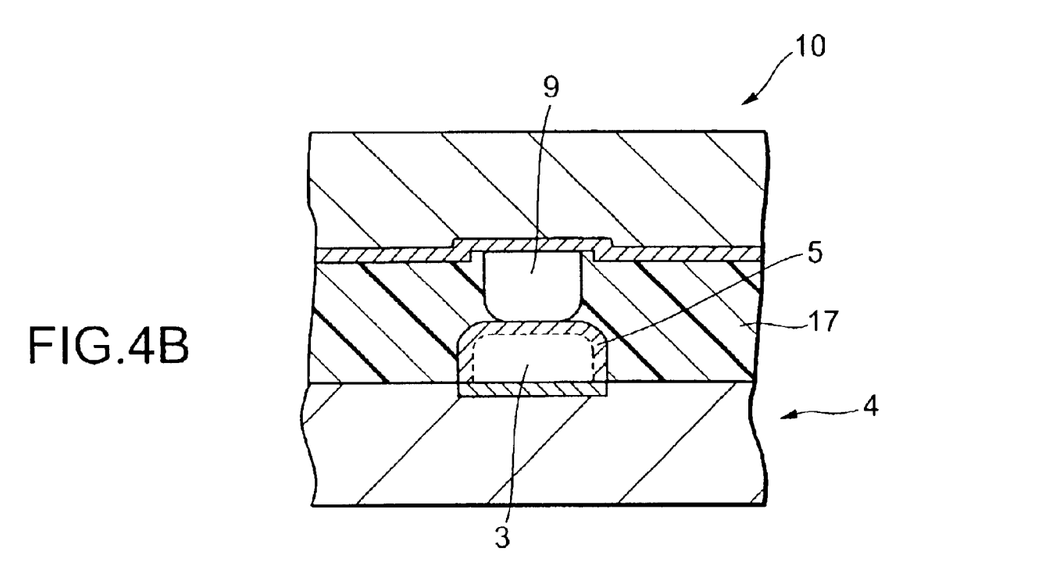

Next, as shown in FIG. 4B, the first semiconductor chip 4 and the second semiconductor chip 10 are overlapped, and the copper bump 3 and the gold bump 9 are aligned on the first semiconductor chip 4. Heated pressure processing is applied. In the pressure processing, it is desirable that ultrasonic vibration is applied. The copper bump 3 and the gold bump 9 are bonded by the pressure processing. In this embodiment, the first adhesive layer 15 and the second adhesive layer 16 are bonded in a process for pressure processing. As described above, as shown in FIG. 4B, an adhesive layer 17 is formed between the first semiconductor chip 4 and the second semiconductor chip 10. The adhesive layer 17 is an organic adhesive such as resin. Such an adhesive layer 17 is formed by closely laminating in a nitrous atmosphere or a vacuum. The surface of the copper bump 3 is prevented from being oxidized by such a method.

In this case, in the process for pressure processing, the first and second adhesive layers 15 and 16 are also mechanically broken by the deformation of the copper bump 3 and the gold bump 9. The temperature of the pressure processing is 150° C. or less. The lowering of the temperature is the same as that described in the first embodiment and the reason is that the diffusion of a copper atom in the copper bump 3 or that of a gold atom in the gold bump 9 is accelerated by a halogen atom in the additive layer 5 on the surface of the copper bump 3. In this case, the breakage of the adhesive layers is also facilitated by applying moderate ultrasonic vibration or mechanical friction by scrubbing or others to the interfaces of bonding when both semiconductor chips are pressed.

In the second embodiment, the similar effect to the effect described in the first embodiment is also produced. Further, a process for sealing a junction called an underfill with resin generally performed in a flip chip joining process is omitted. This reason is that the adhesive layer 17 is automatically provided with a function for sealing with resin.

Next, referring to FIG. 5, a third embodiment of the invention will be described. This embodiment is an example in which the invention is applied to COC technique using only copper bumps.

Figure 5A:
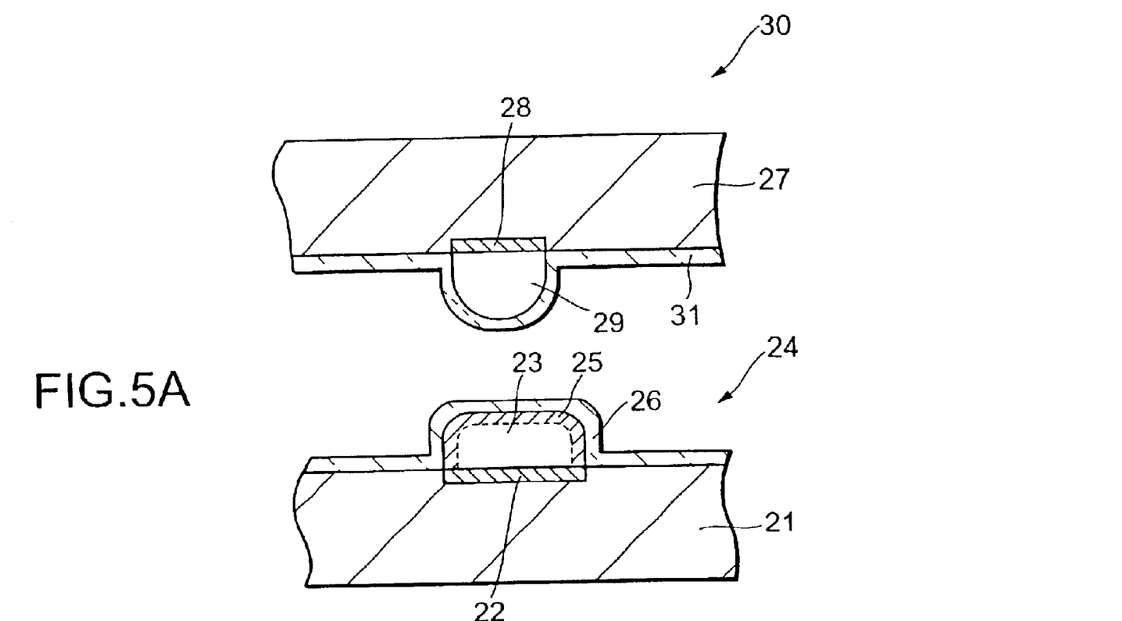
FIGS. 5A and 5B are schematic sectional views showing a bump bonding process for explaining a third embodiment of the invention.

As shown in FIG. 5A, a first semiconductor chip 24 provided with a first pad electrode 22 in a predetermined region on the surface of a first semiconductor substrate 21 and a first copper bump 23 connected to the first pad electrode 22 is formed by the similar method to the method described in the first embodiment. An additive layer 25 is formed on the surface of the first copper bump 23 and a first coating layer 26 is formed on the first semiconductor chip 24 and on the surface of the first copper bump 23.

Similarly, a second semiconductor chip 30 provided with a second pad electrode 28 in a predetermined region on the surface of a second semiconductor substrate 27 and a second copper bump 29 connected to the second pad electrode 28 is formed. A second coating layer 31 is formed on the surface of the second semiconductor chip 30 and on the surface of the second copper bump 29. The first or second coating layer 26 or 31 is formed at the same way as the way described in the first embodiment.

Figure 5B:
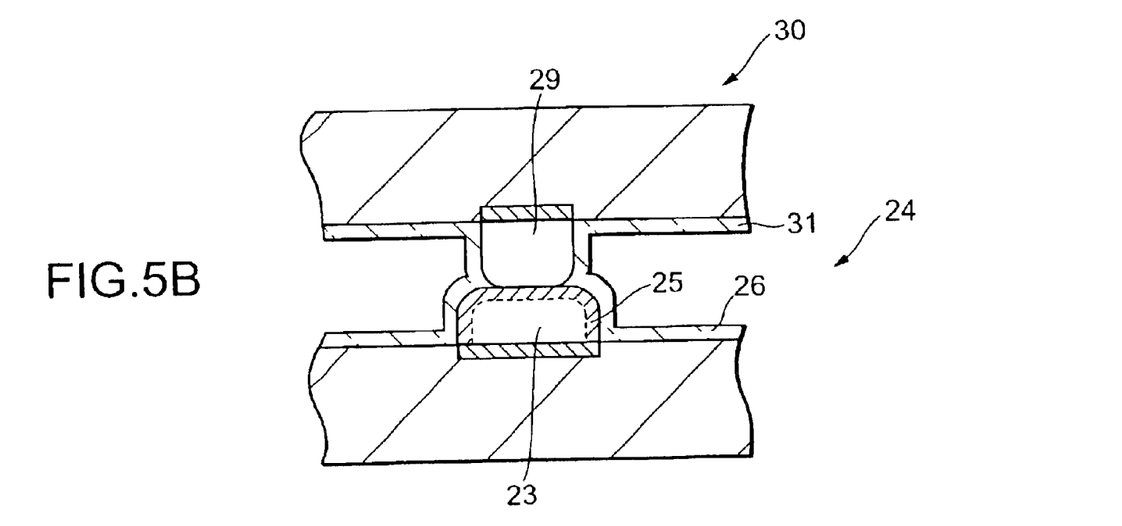

Next, as shown in FIG. 5B, the first semiconductor chip 24 and the second semiconductor chip 30 are overlapped, and the first copper bump 23 on the first semiconductor chip 24 and the second copper bump 29 on the second semiconductor chip 30 are aligned. Heated pressure processing is applied. In the pressure processing, it is desirable that ultrasonic vibration is applied. The first copper bump 23 and the second copper bump 29 are bonded by the pressure processing. In this case, in a process for the pressure processing, a part of the first coating layer 26 and a part of the second coating layer 31 are also mechanically broken by the deformation of the first copper bump 23 and the second copper bump 29. The temperature of the pressure processing is 100° C. or less. The lowering of the temperature is the same as that described in the first embodiment and the reason is that the diffusion of a copper atom in the first and second copper bumps 23 and 29 is accelerated by a halogen atom in the additive layer 25 on the surface of the first copper bump 23. In this case, the breakage of the first and second coating layers is also facilitated by applying moderate ultrasonic vibration or mechanical friction by scrubbing or others to the interfaces of bonding when both semiconductor chips are pressed.

In the third embodiment, the similar effect to the effect described in the first embodiment is also produced. Further, in this case, the first coating layer 26 and the second coating layer 31 function as a passivation film of the semiconductor chips. Therefore, in this case, a process for sealing a junction called an underfill with resin generally performed in a flip chip joining process is also omitted. Also in this case, as both electrodes are a copper bump, the lowering of the temperature of bonding is further facilitated. As described above, the damage of IC or the deterioration of characteristics in mounting caused in prior art is not caused.

In the embodiments, the case that the coating layer is formed by an insulating film is described. The invention is not limited to this and even if the coating layer is formed by a conductive film, for example, a TiN (titanium nitride) film or a TaN (tantalum nitride) film, the similar effect is produced. In case the coating layer is formed by the conductive layer, the coating layer is partially formed so that it coats the surface of the bump and it is required that the coating layer is not formed on the overall surface of the semiconductor chip.

In the second embodiment, as described in the first embodiment, after the coating layer is formed, the adhesive layer may be also formed so that the adhesive layer coats the coating layer.

The invention is not limited to the case of COC technique The invention can be also similarly applied to the bonding of a pad electrode and wire or the bonding of a lead of a package and wire. The invention can be easily applied to technique for connecting a semiconductor chip and a wiring board. Further, the invention can be also similarly applied to the bonding of other metals. The shape of the surface of an electrode to be bonded may be also planar.

The invention is not limited to the embodiments and the embodiments can be suitably changed in a range of technical ideas according to the invention.

As described above, in a principal part of the invention, the additive including at least one type of atom different from an atom forming the electrode for electrically connecting the semiconductor chip and the wiring board or plural semiconductor chips is doped in the vicinity of the surface of the electrode and the insulator is formed on the surface of the electrode.

As described above, bonding between the electrodes at low energy and low stress is facilitated by applying the structure that an atom of the additive easily activated by heating is confined in each superficial region of the electrodes to be bonded. The density of the semiconductor device is enhanced and the reliability of the semiconductor device is greatly enhanced.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device, comprising:

an electrode used for connecting a semiconductor chip and a wiring board or plural semiconductor chips;

an additive layer formed by doping an additive including at least one type of atom different from an atom forming the electrode in the vicinity of the surface of the electrode; and an insulator formed on the surface of the electrode.

2. A semiconductor device according to claim 1, wherein:

the additive at least includes a fluoric (F) atom or a chloric (Cl) atom.

3. A semiconductor device according to claim 1, wherein:

the electrode is formed by an electric conductor mainly made of copper (Cu), gold (Au) or tin (Sn).

4. A semiconductor device according to claim 1, wherein:

the shape of the surface of the electrode is curved.

5. A semiconductor device according to claim 1, wherein:

the electrode is in the shape of a bump.

6. A semiconductor device according to claim 1, wherein:

the insulator is an inorganic insulating film.

7. A semiconductor device according to claim 1, wherein:

the insulator includes silicon nitride.

8. A semiconductor device according to claim 1, wherein:

the insulator is an adhesive.

9. A semiconductor device according to claim 1, wherein:

the insulator has the double structure of an inorganic insulating film for directly coating an electrode and an adhesive for coating the inorganic insulating film.

* * * * *